US008184021B2

(12) United States Patent
Chou

(10) Patent No.: US 8,184,021 B2

(45) Date of Patent: May 22, 2012

(54) KEYBOARD WITH ILLUMINATING ARCHITECTURE

(75) Inventor: Chin-Wen Chou, Taipei Hsien (TW)

(73) Assignee: Zippy Technology Corp., Taipei Hsien (TW)

( * ) Notice: Subject to any disclaimer, the term of this patent is extended or adjusted under 35 U.S.C. 154(b) by 920 days.

(21) Appl. No.: 12/192,494

(22) Filed: Aug. 15, 2008

(65) Prior Publication Data

US 2010/0039297 A1 Feb. 18, 2010

(51) Int. Cl.
*H03K 17/94* (2006.01)

(52) U.S. Cl. .......... 341/22; 341/210; 341/341; 362/560; 345/168; 345/170; 400/472; 200/310

(58) Field of Classification Search .................... 341/22, 341/210–317, 341, DIG. 47; 362/560; 345/168, 345/170, 176, 102, 84; 400/472; 200/310–317
See application file for complete search history.

(56) References Cited

U.S. PATENT DOCUMENTS

| | | | | |
|---|---|---|---|---|
| 5,936,554 | A | 8/1999 | Stanek | |
| 6,179,432 | B1 | 1/2001 | Zhang | |
| 6,199,996 | B1 | 3/2001 | Katrinecz | |
| 6,217,183 | B1 | 4/2001 | Shipman | |
| 6,284,988 | B1 | 9/2001 | Watanabe | |
| 6,322,229 | B1 | 11/2001 | Chan | |
| 6,554,442 | B2 | 4/2003 | Chou | |
| 6,590,508 | B1 | 7/2003 | Howell | |
| 6,648,530 | B2 | 11/2003 | Kamei | |
| 6,860,612 | B2 | 3/2005 | Chiang | |
| 7,235,752 | B1 | 6/2007 | Chen | |
| 7,239,303 | B2 * | 7/2007 | Liao et al. | 345/168 |
| 7,278,750 | B2 | 10/2007 | Cheng | |
| 7,388,167 | B2 * | 6/2008 | Liao et al. | 200/310 |
| 2007/0121311 | A1 * | 5/2007 | Chou | 362/23 |
| 2009/0091478 | A1 * | 4/2009 | Chan et al. | 341/22 |
| 2009/0201179 | A1 * | 8/2009 | Shipman et al. | 341/22 |

FOREIGN PATENT DOCUMENTS

| | | |
|---|---|---|
| TW | 509955 | 11/2002 |
| TW | 516671 | 1/2003 |
| TW | 566612 | 12/2003 |
| TW | 581961 | 4/2004 |
| TW | 587800 | 5/2004 |
| TW | 594546 | 6/2004 |
| TW | M240668 | 8/2004 |
| TW | I230957 | 4/2005 |
| TW | I231693 | 4/2005 |
| TW | I269333 | 12/2006 |
| TW | M313281 | 6/2007 |

* cited by examiner

*Primary Examiner* — Patrick Salce
(74) *Attorney, Agent, or Firm* — Muncy, Geissler, Olds & Lowe, PLLC

(57) ABSTRACT

A keyboard with illuminating architecture includes a keyboard portion and a substrate carrying the keyboard portion, wherein the keyboard portion includes a plurality of pressing elements for receiving a pressing force from the user and inter-dependent mechanisms respectively under a force receiving surface of each pressing element for providing a moving stroke of the pressing element following the force direction, and the substrate has an assembling portion for assembling with the other end of the inter-dependent mechanism. Moreover, the surface of the substrate has at least one light guiding groove, which forms a light channel for transmitting light, and at least one inner sidewall of the light guiding groove is a light reflecting surface, so that the light in the light guiding groove is reflected by the light reflecting surface to the keyboard portion, thereby providing the pressing elements the brightness, and reducing whole keyboard thickness and thinning.

11 Claims, 7 Drawing Sheets

KEYBOARD WITH ILLUMINATING ARCHITECTURE

FIELD OF THE INVENTION

The present invention is related to a keyboard, and more particularly to a keyboard with illuminating architecture.

BACKGROUND OF THE INVENTION

Since keyboard device is the main input device in computer system, it has to conform to different developments and using demands of computer system due to the diversification of using environment and timing. For providing the user the positions of each key in a dark environment, a keyboard with illuminating capability is developed, such as U.S. Pat. No. 5,936,554, U.S. Pat. No. 7,278,750, TWP No. 566612 and TWP No. 581961, which respectively disclose a keyboard device with LEDs (Light Emitting Diode) mounted therein and each LED provides light for a single key, so that the keys can be clearly recognized in the dark. Although this kind of keyboard can prevent the incapability of recognizing the keys' positions in the dark, since the standard keyboard has more than one hundred keys and each key has to equip with the corresponding LED, the whole amount of components becomes much greater, the manufacturing process and cost are definitely increased and the weight even becomes larger. Besides, the power consumption and heat production owing to the large amount of LEDs also might influence the user.

Another kind of keyboard with illuminating capability is disclosed as U.S. Pat. No. 6,179,432, U.S. Pat. No. 6,199,996, U.S. Pat. No. 6,217,183, U.S. Pat. No. 6,284,988, U.S. Pat. No. 6,322,229, U.S. Pat. No. 6,554,442, U.S. Pat. No. 6,590,508, U.S. Pat. No. 6,648,530, U.S. Pat. No. 6,860,612, U.S. Pat. No. 7,235,752, U.S. Pat. No. 7,239,303, and U.S. Pat. No. 7,388,167, and TWP No. 509955, TWP No. 516671, TWP No. 587800, TWP No. 594546, TWP No. I230957, TWP No. I231693, TWP No. M240668, and TWP No. M313281. All these patents are related to additionally mount an illuminating plate, such as electroluminescent sheet, or optical fiber panel, above or under the bottom plate of the keyboard, so that the keys above the illuminating plate can shine for recognition. Compared with the keyboard which mounts the LEDs inside the keys, the keyboard using one single illuminating plate can shine uniformly and also can reduce the amount of components and facilitate the assembly. Besides, the low power consumptions of the electroluminescent sheet and the optical fiber panel are both low and are also advantageous to long term usage. Furthermore, TWP No. I269333 and U.S. application Ser. No. 11/288,258 also disclose a keyboard with back light architecture, wherein a light source transmitting space is defined between the plank and the bottom board and at least a light guiding portion corresponding to the light source on the keyboard portion toward the light source transmitting space is mounted on the plank, so that the light guiding portion can receive the light inputting the light source transmitting space and guide the light to the keyboard portion, thereby forming the back light architecture of the keyboard.

SUMMARY OF THE INVENTION

The object of the present invention is to simplify the components of an illuminating keyboard and achieve the purpose of thinning.

For achieving the purpose described above, the present invention provides a keyboard with illuminating architecture including a keyboard portion and a substrate carrying the keyboard portion, wherein the keyboard portion includes a plurality of pressing elements for receiving a pressing force from the user and inter-dependent mechanisms respectively under a force receiving surface of each pressing element for providing a moving stroke of the pressing element following the force direction, and the substrate has an assembling portion for assembling with the other end of the inter-dependent mechanism. Moreover, the surface of the substrate has at least a light guiding groove, which forms a light channel for transmitting light, and at least one inner sidewall of the light guiding groove is a light reflecting surface, so that the light in the light guiding groove is reflected by the light reflecting surface to the keyboard portion, thereby providing the pressing elements the brightness.

Furthermore, the substrate includes a plank for mounting the assembling portion and a circuit board triggered by the contact of the pressing elements for producing indicating signals. The light guiding groove can be formed to have a V-shaped or U-shaped structure, so that the light can be reflected back and forth and transmitted in the light guiding groove. For providing the illuminating spaces formed between the pressing elements and the substrate the uniform brightness, the light guiding groove can have at least a smooth slope or at least a step structure mounted thereon, so that the depth of the light guiding groove can be gradually reduced as the distance to the illuminator increases. Besides, the illuminator can be mounted at the end of the light guiding groove or in the light guiding groove.

Thereby, through utilizing the light guiding groove to transmit light, the keyboard with illuminating architecture according to the present invention can reduce the required amount of LEDs, so as to simplify the numbers of the whole components. In addition, since the present invention does not need to mount illuminating layer such as electroluminescent sheet or optical fiber panel inside the keyboard, the thickness of keyboard can be reduced so as to achieve thinning.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DESCRIPTION OF THE PREFERRED EMBODIMENT

Figure 1:
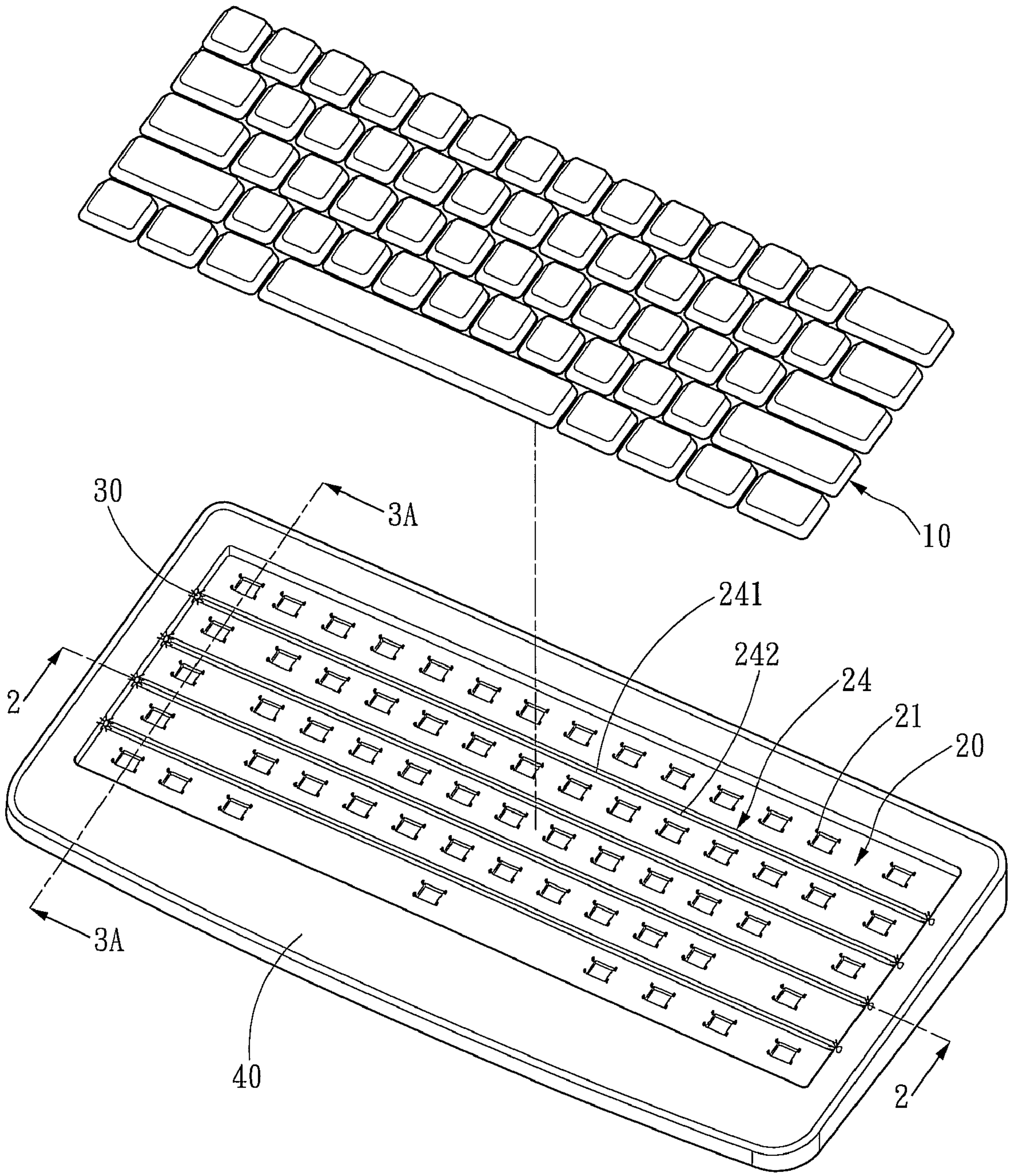
FIG. 1 is a partial decomposition drawing showing a keyboard with illuminating architecture in a preferred embodiment according to the present invention.
Figure 2:
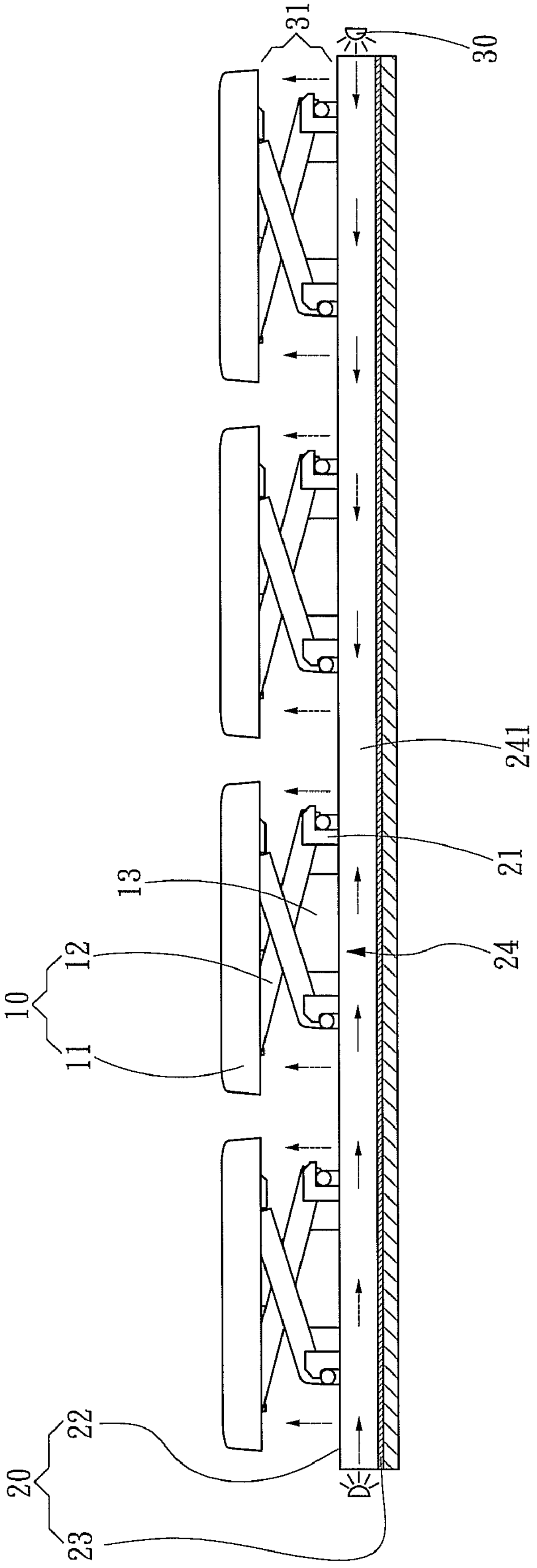
FIG. 2 is a sectional view showing the 2-2 line in FIG. 1.
Figure 3A:
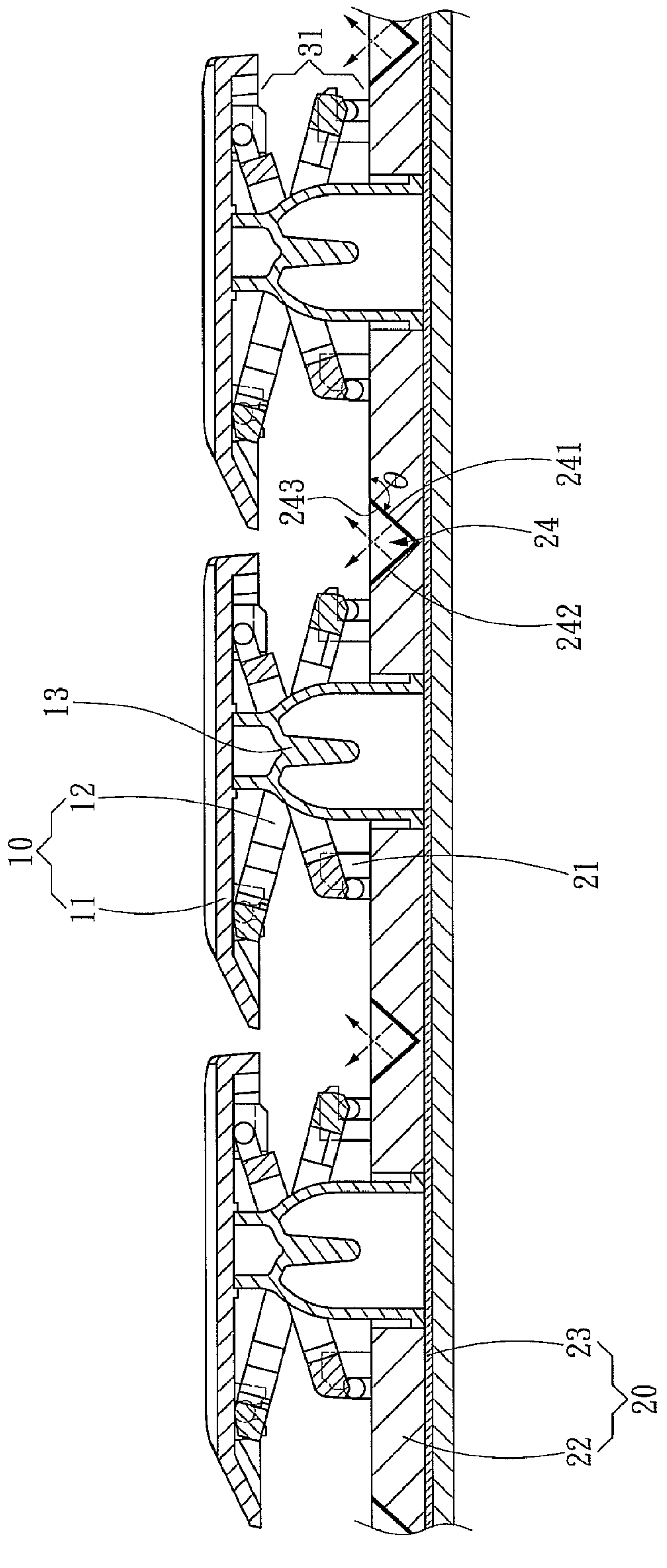
FIG. 3A is a sectional view showing the 3A-3A line in FIG. 1.

Please refer to FIG. 1, FIG. 2 and FIG. 3A, which respectively showing a partial decomposition drawing of a preferred embodiment, a sectional view of 2-2 line in FIG. 1 and a sectional view of 3A-3A line in FIG. 1. As shown, the present invention is related to a keyboard with illuminating architecture including a keyboard portion 10 in a housing 40 and a substrate 20, wherein the substrate 20 is used to carry the keyboard portion 10. The keyboard portion 10 includes a plurality of pressing elements 11 for receiving the pressing force from the user, and a plurality of inter-dependent mechanisms 12 under the force receiving surface of the pressing elements 11 for providing a moving stroke of the pressing elements 11 following the force direction. The inter-dependent mechanism 12 includes a flexible element 13 for providing the pressing element 11 the upward and downward movements. The substrate 20 has an assembling portion 21 for assembling with the other end of the inter-dependent mechanism 12, so that the keyboard portion 10 can be installed on the substrate 20. In this embodiment, the substrate 20 includes a plank 22 for mounting the assembling portion 21 and a circuit board 23 triggered by the contact of the pressing element 11 for producing indicating signal.

Figure 4:
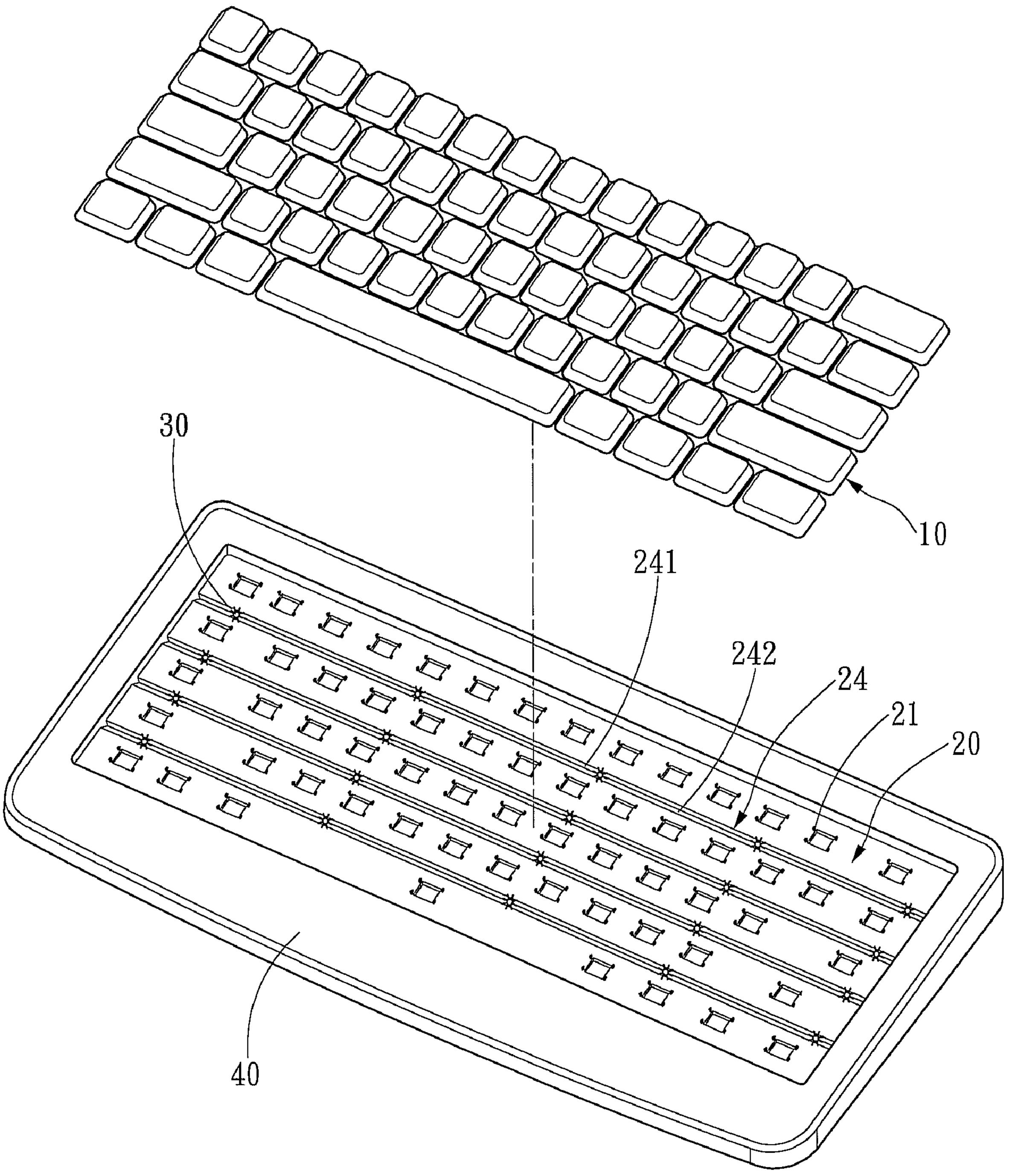
FIG. 4 is a schematic view showing an illuminator mounted in the light guiding groove in a preferred embodiment according to the present invention.

The surface of the substrate 20 has at least a light guiding groove 24, which forms a light channel for transmitting light, and the light guiding groove 24 and an illuminating space 31 between the pressing element 11 and the substrate 20 can have a light communication. Moreover, the substrate 20 has an illuminator 30 mounted thereon for inputting light into the light guiding groove 24, so that the light can move along the light channel. Here, the illuminator 30 can be located at the end of the light guiding groove 24, as shown in FIG. 1, or can be located in the light guiding groove 24, as shown in FIG. 4, so as to provide light in the light guiding grove 24.

Figure 3B:
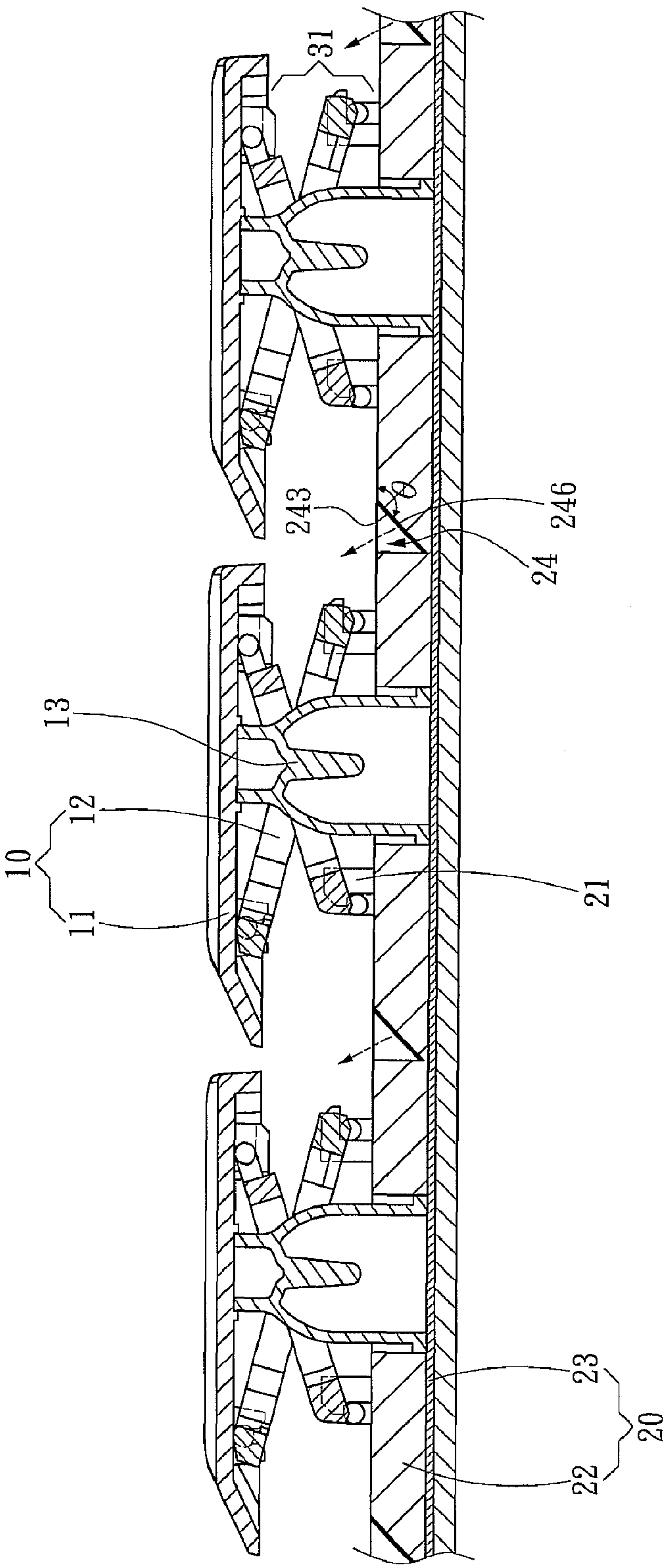
FIG. 3B is a sectional view showing a light guiding groove with one inner sidewall served as the light reflecting surface in a preferred embodiment according to the present invention.

Furthermore, at least one inner sidewall of the light guiding groove 24 is a light reflecting surface. In the embodiment, as shown in FIG. 3A, the light guiding groove 24 has two light reflecting surfaces, a first light reflecting surface 241 and a second light reflecting surface 242. Therefore, for distributing the light from the light guiding groove 24 into the illuminating space 31, the light guiding groove 24 is formed to have a V-shaped or U-shaped structure. The first light reflecting surface 241 or the second light reflecting surface 242 has a reflection angle $\theta$ related to the substrate 20, wherein the reflection angle $\theta$ is ranged from 180° to 0°, and the first light reflecting surface 241 and the second light reflecting surface 242 are both coated with a light reflecting layer 243. When the illuminator 30 produces and inputs light into the light guiding groove 24, on one hand, the light can have a back and forth transmission between the first light reflecting surface 241 and the second light reflecting surface 242 for moving along the light guiding groove 24 toward the far end, and on the other hand, owing to the light guiding groove 24 formed between the pressing element 11 and the substrate 20 and the reflection angle $\theta$, the light can be reflected into the illuminating space 31 for providing the pressing element 11 brightness. Besides, it also can be that only one of the inner sidewalls in the light guiding grooves 24 serves as the light reflecting surface 246. In the embodiment, as shown in FIG. 3B, the light reflecting surface 246 has a reflecting angle $\theta$ related to the substrate 20, wherein the reflecting angle $\theta$ is ranged from 180° to 0°, and the light reflecting surface 246 has coated with a light reflecting layer 243. When light goes into the light guiding groove 24, the light reflecting surface 246 can reflect the light into the illuminating space 31 to the pressing elements 11.

Figure 5:
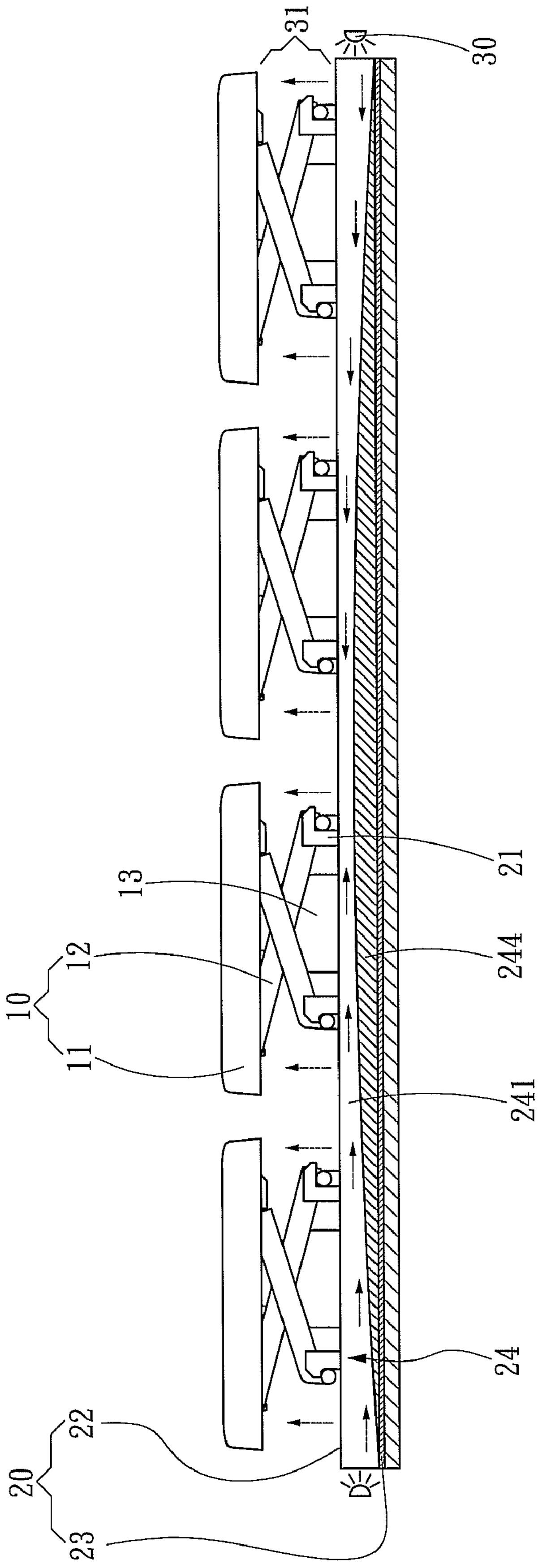
FIG. 5 is a schematic view showing the light guiding groove having a smooth slope therein according to the present invention.
Figure 6:
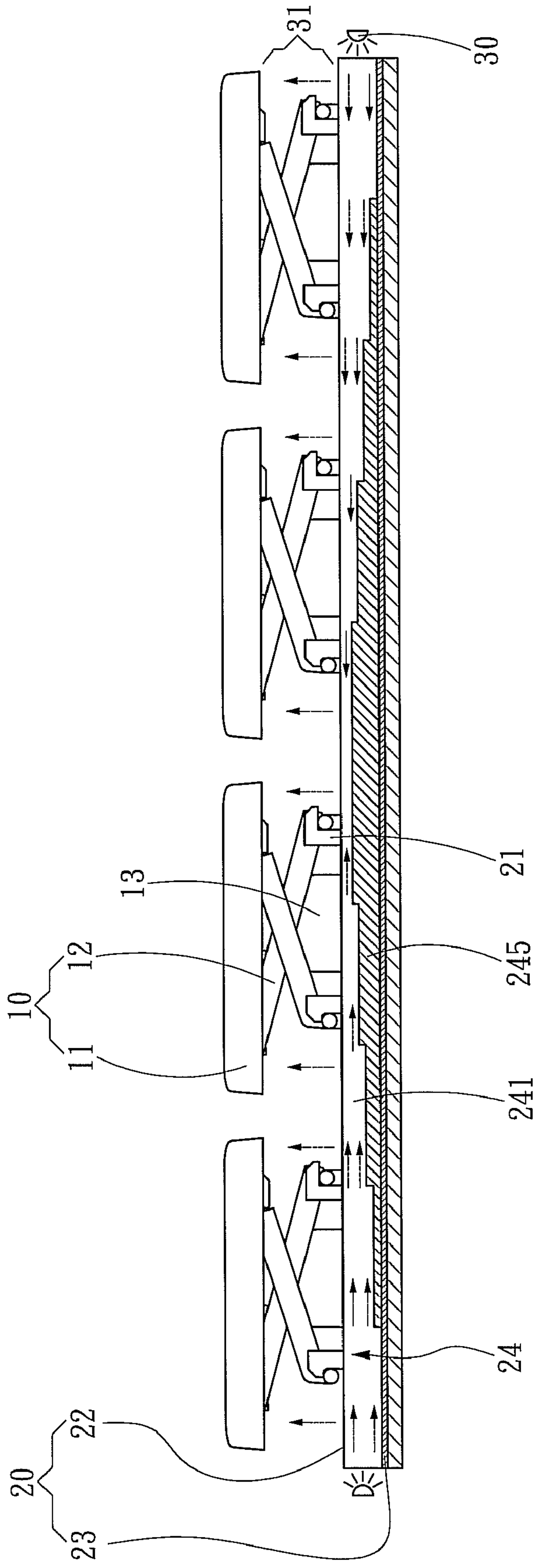
FIG. 6 is a schematic view showing the light guiding groove having a step structure therein according to the present invention.

When light is produced by the illuminator 30, the brightness might be reduced gradually as the transmission distance increases. Therefore, in another embodiment of the present invention, as shown in FIG. 5, the depth of the light guiding groove 24 can be gradually reduced as the distance to the illuminator 30 becomes larger, that is, when light goes into the light guiding groove 24, the farer the distance to the illuminator 30, the shallower the depth of the light guiding groove 24, so that the reflection space inside the light guiding groove 24 becomes smaller for distributing light to the illuminating space 30 easier, thereby providing the keyboard a more uniform illumination. In this embodiment, the light guiding groove 24 has therein at least a smooth slope 244 for adjusting the depth of the light guiding groove 24, or the light guiding groove 24 has therein at least a step structure 245, as shown in FIG. 6, so that the depth can becomes shallower as the distance to the illuminator 30 increases.

In the aforesaid, according to the present invention, the keyboard with illuminating architecture only needs to install few illuminators and the light guiding groove can transmit and distribute light to the illuminating space under the keyboard portion, the amount of illumination components can be reduced, and the whole thickness of the keyboard also can be reduced, thereby achieving the thin purpose. Furthermore, the depth of the light guiding groove can be adjusted for responding to the gradually increased distance to the illuminator, so that the illuminating spaces can have uniform brightness.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A keyboard with illuminating architecture, comprising:

a keyboard portion including a plurality of pressing elements for receiving a pressing force from the user and inter-dependent mechanisms respectively under a force receiving surface of each pressing element for providing a moving stroke of the pressing element following the force direction; and a substrate including an assembling portion for assembling with the other end of the inter-dependent mechanism to carry the keyboard portion and at least one light guiding groove formed and extended horizontally on the surface of the substrate;

the light guiding groove includes at least one light reflecting surface at an inner sidewall of the light guiding groove to form a light channel for transmitting light, so that the light in the light guiding groove is reflected by the light reflecting surface to the keyboard portion, thereby providing the pressing elements the brightness.

2. The keyboard as claimed in claim 1, wherein the light guiding groove is formed to have a V-shaped structure.

3. The keyboard as claimed in claim 1, wherein the light guiding groove is formed to have an U-shaped structure.

4. The keyboard as claimed in claim 1, wherein two inner sidewalls of the light guiding groove are two light reflecting surfaces which respectively reflects light to the keyboard portion.

5. The keyboard as claimed in claim 1, wherein the depth of the light guiding groove is gradually reduced as the distance to a light source increases.

6. The keyboard as claimed in claim 1, wherein the light guiding groove has at least one smooth slope therein.

7. The keyboard as claimed in claim 1, wherein the light guiding groove has at least one step structure therein.

8. The keyboard as claimed in claim 1, wherein the light reflecting surface is coated with a light reflecting layer.

9. The keyboard as claimed in claim 1, wherein the light guiding groove has an illuminator mounted at the end thereof.

10. The keyboard as claimed in claim 1, wherein the light guiding groove has an illuminator mounted therein.

11. The keyboard as claimed in claim 1, wherein the substrate includes a plank for mounting the assembling portion and a circuit board triggered by the contact of the pressing elements for producing indicating signals.

* * * * *